(12) United States Patent
Omid-Zohoor et al.

(10) Patent No.: US 9,780,755 B1
(45) Date of Patent: Oct. 3, 2017

(54) ON FLEX CIRCUIT DESENSE FILTER FOR WIRELESS COMMUNICATIONS

(71) Applicant: Apple Inc., Cupertino, CA (US)

(72) Inventors: Kasra M. Omid-Zohoor, San Francisco, CA (US); Marc Joseph Devincentis, Palo Alto, CA (US); Paolo Sacchetto, Cupertino, CA (US); Youchul Jeong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/268,490

(22) Filed: Sep. 16, 2016

(51) Int. Cl.
| | | |
|---|---|---|
| H05K 1/00 | (2006.01) |
| H03H 1/00 | (2006.01) |
| H05K 9/00 | (2006.01) |
| H01F 27/28 | (2006.01) |
| H01F 27/29 | (2006.01) |
| H03J 5/02 | (2006.01) |
| G09G 3/20 | (2006.01) |
| H04W 84/12 | (2009.01) |
| H04W 4/00 | (2009.01) |

(52) U.S. Cl.
CPC ....... *H03H 1/0007* (2013.01); *H01F 27/2804* (2013.01); *H01F 27/29* (2013.01); *H03J 5/0209* (2013.01); *H05K 9/0081* (2013.01); *G09G 3/2092* (2013.01); *H03H 2210/025* (2013.01); *H04W 4/008* (2013.01); *H04W 84/12* (2013.01)

(58) Field of Classification Search
CPC ... H03H 1/0007; H01F 27/2804; H01F 27/29; H03J 5/0209; H05K 9/0081
USPC ............ 361/679.01, 748–751, 760, 761
See application file for complete search history.

(56) References Cited

U.S. PATENT DOCUMENTS

| | | | | |
|---|---|---|---|---|
| 2012/0075216 A1* | 3/2012 | Black | ............ | G02B 26/001 345/173 |
| 2016/0358849 A1* | 12/2016 | Jur | ............ | H05K 1/0283 |

* cited by examiner

*Primary Examiner* — Tremesha S Willis
(74) *Attorney, Agent, or Firm* — McDermott Will & Emery LLP

(57) ABSTRACT

An apparatus for on flex desensing, includes a flex circuit including one or more DC traces, and at least one desense filter including a transformer having a primary winding coupled to at least one of the DC traces. Each desense filter includes one or more circuits coupled to a secondary winding of the transformer. Each of the circuits includes a variable capacitor connected in parallel with a resistor, and each desense filter is tunable to filter a desense frequency in a frequency band associated with one or more wireless communication protocols.

20 Claims, 10 Drawing Sheets

ON FLEX CIRCUIT DESENSE FILTER FOR WIRELESS COMMUNICATIONS

TECHNICAL FIELD

The present description relates generally to integrated circuits, and more particularly, to an on flex circuit desense filter for wireless communications.

BACKGROUND

Many mobile communication devices such as phones, tablets, and phablets are equipped with high-speed links capable of providing high definition video and/or high data-rate storage. The use of more sensitive, wide-band, and/or smart antennas in these communication devices is becoming more and more widespread. The higher sensitivity and the broader bandwidth of these antennas make them more susceptible to electro-magnetic interference (EMI), in particular, the EMI noise generated by various circuitry of the communication device itself.

For example, the EMI noise generated by a display driver or a power-management integrated circuit (PMIC) of a mobile communication device can cause ~3 dB broadband noise in a frequency band of a wireless communication protocol (e.g., LTE, Wi-Fi, or Bluetooth) which can lead to dropped calls or reduced connectivity. When the noise source is far from the RF ground, filtering the noise by decoupling capacitors connecting noisy traces to ground is not an option. Therefore, as the noise travels through the exposed flex traces, it radiates to the antennas, causing desense.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, solutions for filtering electro-magnetic interference EMI noise, referred to as desense noise, is generated by a noise source and propagated through conductor traces (e.g., of a flex circuit) are provided. The generated EMI noise can cause desensing of antenna(s) of a transceiver over one or more frequencies of the communication frequency band of the transceiver. The desense filters of the subject technology can substantially reduce the desense noise at or near the location where it is generated. The disclosed filters can be readily implemented on the same flex circuit, the conductor traces of which are connected to the noise source.

Figure 1:
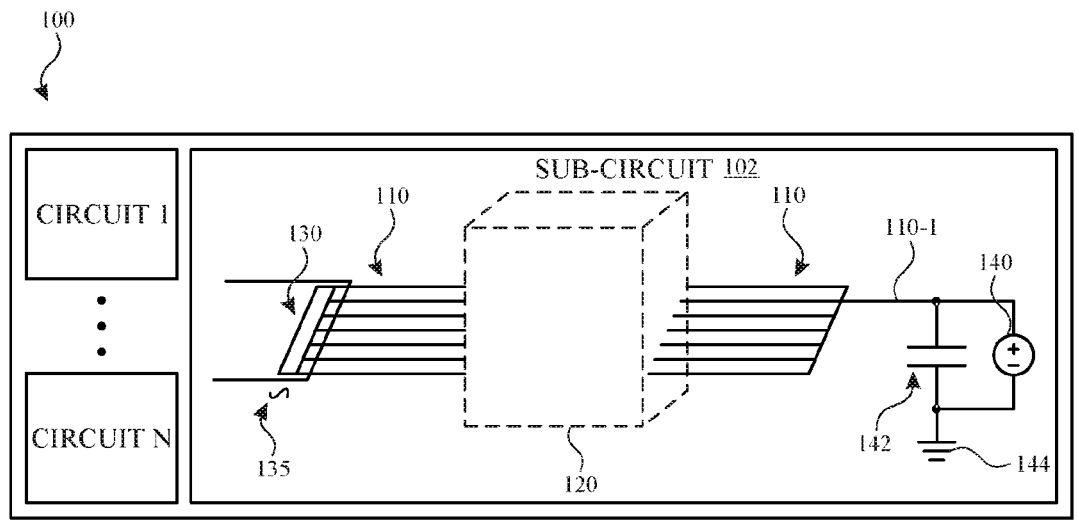
FIG. 1 is a high-level diagram illustrating an example of a system architecture in which the subject technology operates.

FIG. 1 is a high-level diagram illustrating an example of a system architecture 100 in which the subject technology operates. The system architecture 100 may include a number of analog and digital circuitry including circuit 1 through circuit N. For example, circuit 1 through circuit N can include one or more radio-frequency (RF) transmitter and/or receiver circuits, processors, memory, power management units, driver circuits, digital-to-analog converter (DAC), analog-to-digital converter (ADC), and/or other circuits that can generate a significant amount of noise. In some aspects, the system architecture 100 corresponds to a wireless communication device such as a mobile phone, a tablet, a watch, a wireless headphone, or other wireless communication devices. Many of the noise generating circuits can be located near a ground potential (e.g., RF ground), such that the generated noise can be effectively directed to the RF ground through a suitable coupling capacitor.

In some aspects, a sub-circuit 102 of the system architecture 100 includes a noise source 130, a power source 140, a bypass capacitor 142, conductor traces 110, an RF ground 144, and an EM shield 120. In one or more aspects, the sub-circuit 102 is implemented on a flex circuit such as a multi-layer flex circuit including conductor traces (e.g., 110) routed through various layers of the flex circuit. The noise source 130 can generate EMI noise 135 and is coupled to the power source 140 via a conductor trace 110-1. In some aspects, noise source 130 is sufficiently far from the RF ground 144 such that bypassing the generated EMI noise 135 through a bypass capacitor to the RF ground in not practical. The bypass capacitor 142 is coupled in parallel with the power source 140 (e.g., battery) and can provide a path to the RF ground 144 for any noise reaching the power source 140. A portion of the conductor traces 110, may be covered by the EM shield 120, which may be used to shield a sensitive portion of the sub-circuit 102 against outside interferences. The exposed portions of the conductor trace 110 including the DC carrying conductor trace 110-1 can act as an antenna and radiate the EMI noise generated by the noise source 130. Such EMI noise can desense an antenna of the system, at least for a number of frequencies or a portion of a frequency-band of a communication protocol.

In some aspects, the noise source 130 can be a display driver of a wireless communication device (e.g., a mobile phone) that can be at a far distance from a backplane RF ground and may operate at a high data-rate (e.g., within the range of about 1.2 to 2.7 Gbps). Such a high data-rate display driver can generate a significant amount (e.g., about 3 dB) of broadband noise in the frequency-band of, for example, long-term-evolution (LTE) communication protocol (e.g., at about 2300 GHz). In one or more aspects, the noise source 130 can be a power management integrated circuit (PMIC) of a wireless communication device that is implemented on a flex circuit and is far from the backplane RF ground. For example, in small wireless communication devices such as watches, the PMIC can be far from the backplane RF ground and cannot be shielded due to the small available footprint. The EMI noise generated by the PMIC can be broadband noise that interfere with the frequency-band of the Wi-Fi (e.g., about 2.4 GHz band) and Bluetooth (e.g., about 2.4-2.485 GHz) communication protocols.

Figure 2:
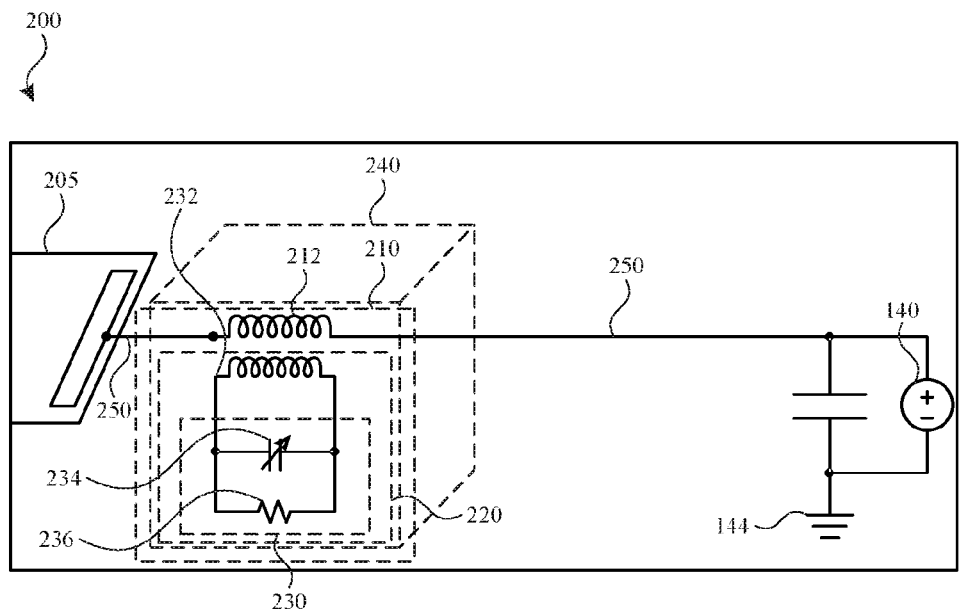
FIG. 2 illustrates an example schematic diagram including a desense filter, in accordance with one or more aspects of the subject technology.

FIG. 2 illustrates an example schematic diagram 200 including a desense filter 210, in accordance with one or more aspects of the subject technology. The schematic diagram 200 includes the noise source 205, a desense filter (apparatus) 210, a shield 240, a conductor trace 250, and the power source 140. In some aspects, the noise source 205 can be a display driver circuit or a PMIC that is far from the RF ground 144 and is coupled via the conductor trace 250 of a flex circuit (e.g., a multi-layer flex circuit) to the power source 140. The desense filter 210 is positioned as close as possible to the noise source 205.

The desense filter 210 includes a transformer having a primary winding 212 and a secondary winding 232. The terminals of the primary winding 212 are connected through the conductor trace 250 to the power source 140 and the noise source 205. The secondary winding 232 is coupled in parallel with an RC circuit 230, which can include a variable capacitor 234 and a resistor 236. The secondary winding 232 forms a resonant circuit with the variable capacitor 234 that can trap the noise energy and cause the noise energy to be dissipated as heat in the resistor 236. In some aspects, the primary and secondary windings 212 and 232 can be implemented on different layers of the multi-layer flex circuit, as explained below. In some aspects, multiple desense filters similar to the desense filter 210 can be applied. In one or more implementations, each of the desense filters may be tuned to a different desense frequency to provide a wider desense band including multiple desense frequencies.

Figure 3:
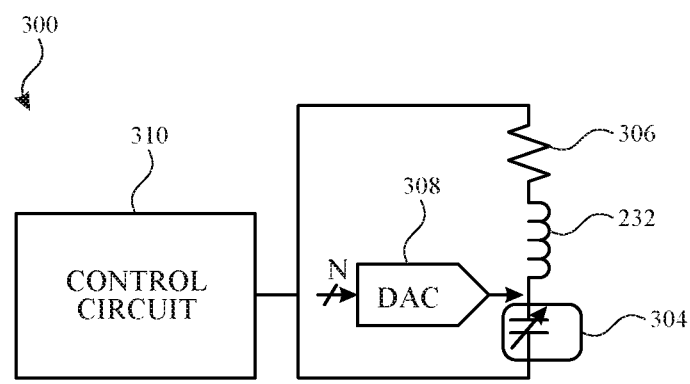
FIG. 3 illustrates a schematic diagram of an exemplary secondary winding circuit of the desense filter of FIG. 2, in accordance with one or more aspects of the subject technology.

FIG. 3 illustrates a schematic diagram of an exemplary secondary winding circuit 300 of the desense filter 210 of FIG. 2, in accordance with one or more aspects of the subject technology. The secondary circuit 300 includes the secondary winding 232, a resistor 306, a variable capacitor 304, and a DAC circuit 308 controlled by a control circuit 310. In the embodiment shown as the secondary circuit 300 the resistor 306 and the variable capacitor 304 are connected in series with the secondary winding 232. The impedance of the resonant circuit formed by the inductance of the secondary winding 232 and the variable capacitor 304 can be reduced to nearly zero Ohm at a resonance frequency $(f_r)=1/2\pi\sqrt{LC}$), where L and C are the inductance and capacitance of the secondary winding 232 and the variable capacitor 304, respectively. Therefore, the energy of the noise at a noise frequency $f_n(\sim f_r)$ is almost entirely dissipated in the resistor 306.

The resonant frequency of the secondary circuit 300 can be tuned to the noise frequency $f_n$ by changing the capacitance (C) of the variable capacitor 304. The tuning can be achieved through the use of the DAC circuit 308, the digital input (e.g., N bits) of which is provided by the control circuit 310. In some embodiments, the control circuit 310 includes a processor, such as a general processor or a microcontroller. In some implementations, the control circuit 310 may operate based on a feedback, for example, from a current passing through the secondary circuit 300 and change the digital input of the DAC circuit 308 to set the current to a desired (e.g., highest) value.

Figure 4:
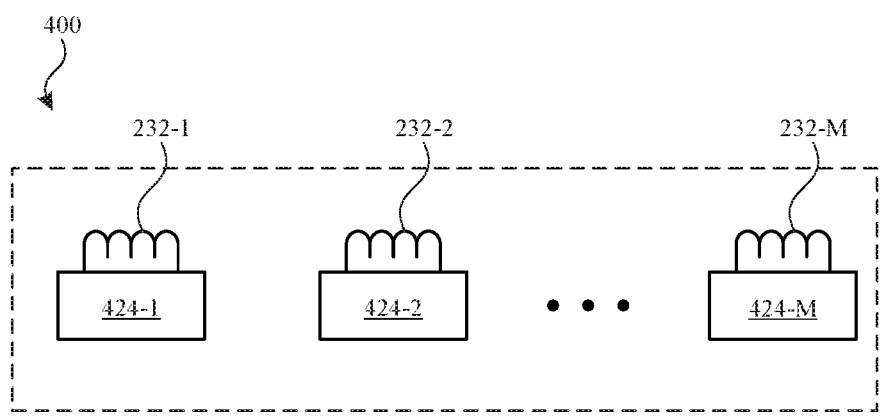
FIG. 4 illustrates a schematic diagram of an exemplary secondary winding circuit of the desense filter of FIG. 2, in accordance with one or more aspects of the subject technology.

FIG. 4 illustrates a schematic diagram of an exemplary secondary winding circuit 400 of the desense filter of FIG. 2, in accordance with one or more aspects of the subject technology. In some aspects, the transformer of the desense filter 210 of FIG. 2 has multiple (e.g., M) secondary windings 232 (e.g., 232-1, 232-2 . . . 232-M) as shown in the secondary circuit 400. Each secondary winding (e.g., 232-1) is coupled in series or in parallel with an RC circuit 424-1 of multiple RC circuits (e.g., 424-1, 424-2 . . . 424-M). In some implementations, each of the RC circuit 424 may be tuned to a different desense frequency to provide a wider desense band including multiple desense frequencies. In one or more aspects, each of the secondary windings 232 can be implemented on a separate layer of the multilayer flex circuit. In some implementations, the variable capacitor of each RC circuit 424 is controlled by a separate DAC circuit.

Figure 5:
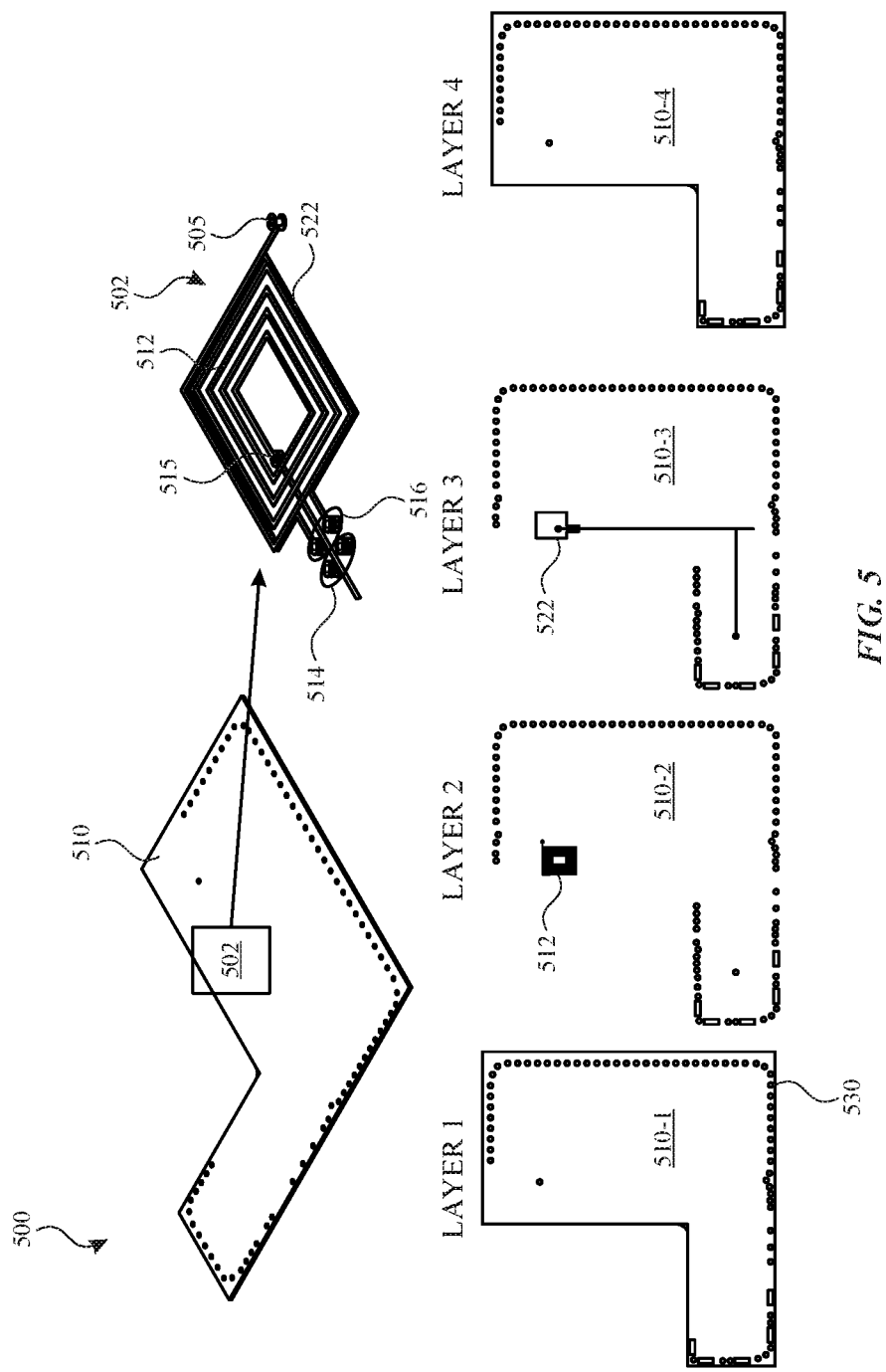
FIG. 5 is a diagram illustrating an example on-flex implementation of primary and secondary windings of the desense filter of FIG. 2, in accordance with one or more aspects of the subject technology.

FIG. 5 is a diagram illustrating an example on-flex implementation 500 of primary and secondary windings of the desense filter of FIG. 2, in accordance with one or more aspects of the subject technology. As explained above, exposed (unshielded) portions of one or more conductor traces of a flex circuit 510 may radiate the noise generated by a noise source such as a display driver or a PMIC of a wireless communication device. The subject technology enables drastically reducing this noise near the source by implementing an apparatus (desense filter) 502 on the flex circuit 510.

In some aspects, the apparatus 502 includes a transformer, the primary winding and secondary windings of which can be implemented, respectively, as loops 512 and 522 on one or more layers of the flex circuit 510. The primary loops 512 are connected at nodes 505 and 515 to a conductor trace of the flex circuit 510 that is coupled to the noise source. The nodes of the secondary loop 522 are coupled to a resistor 514 and a variable capacitor 516, which may or may not be implemented on the flex circuit 510. The flex circuit 510 can be multi-layer flex circuit having a number of (e.g., 4) layers (e.g., 510-1 through 501-4). The flex circuit 510 may include fencing vias 530 that pass through all four layers of the flex circuit and can play a role in shielding the flex circuit against, for example, substrate mode EMI. In some aspects, the primary loops 512 and the secondary loop 522 may be implemented using conductor traces on layers 510-2 and 510-3 of the multi-layer flex circuit 510. The capacitance of the variable capacitor 516 and the resistance of the resistor 514 can be suitably chosen to maintain the desense frequency of the desense filter at a desired location on the frequency band of a wireless communication protocol, as explained below.

Figure 6:
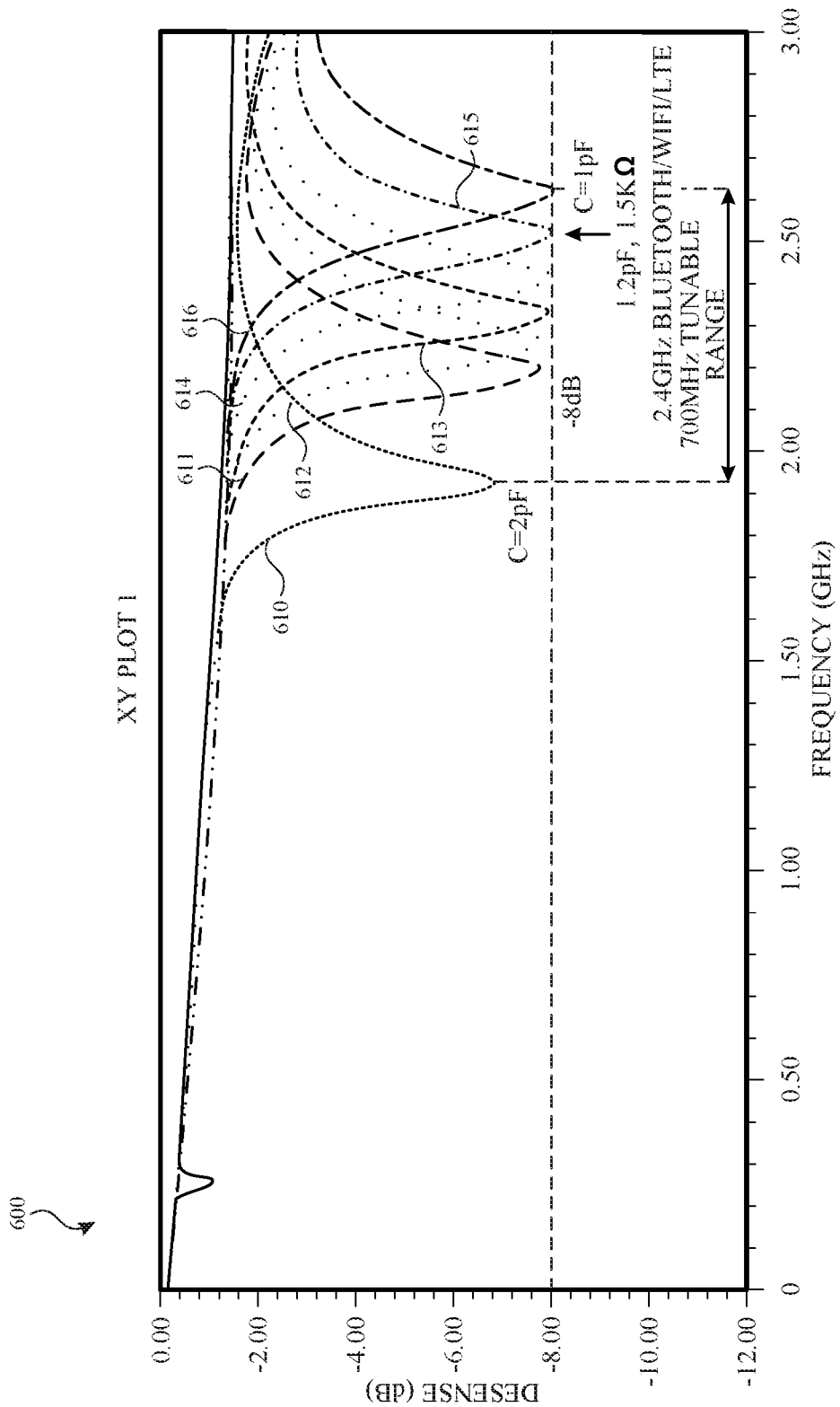
FIG. 6 is a chart illustrating example plots of frequency response of the desense filter of FIG. 2, in accordance with one or more aspects of the subject technology.

FIG. 6 is a chart illustrating example plots 610 through 617 of the frequency response 600 of the desense filter 210 of FIG. 2, in accordance with one or more aspects of the subject technology. As explained above the frequency response of the desense filter 210 is dependent on a value of the capacitance of the variable capacitor (e.g., 304 of FIG. 3). Plots 610 through 617 show the frequency response for a range of capacitor values from about 2 pF to about 1 pF. The frequency responses are the result of simulation of the desense filter using a high-frequency electromagnetic field simulation program such as the known high-frequency structural simulator (HFSS). The highest desense (dB) achieved by the filter is about −8 dB, which is more than enough to attenuate the measured noise of about 3 dB at the desired frequency. The tunable frequency range of the desense filter by changing the capacitance of the variable capacitor is about 700 MHz in the 2.4 GHz band of Wi-Fi, Bluetooth, and/or LTE communication protocols.

Figure 7:
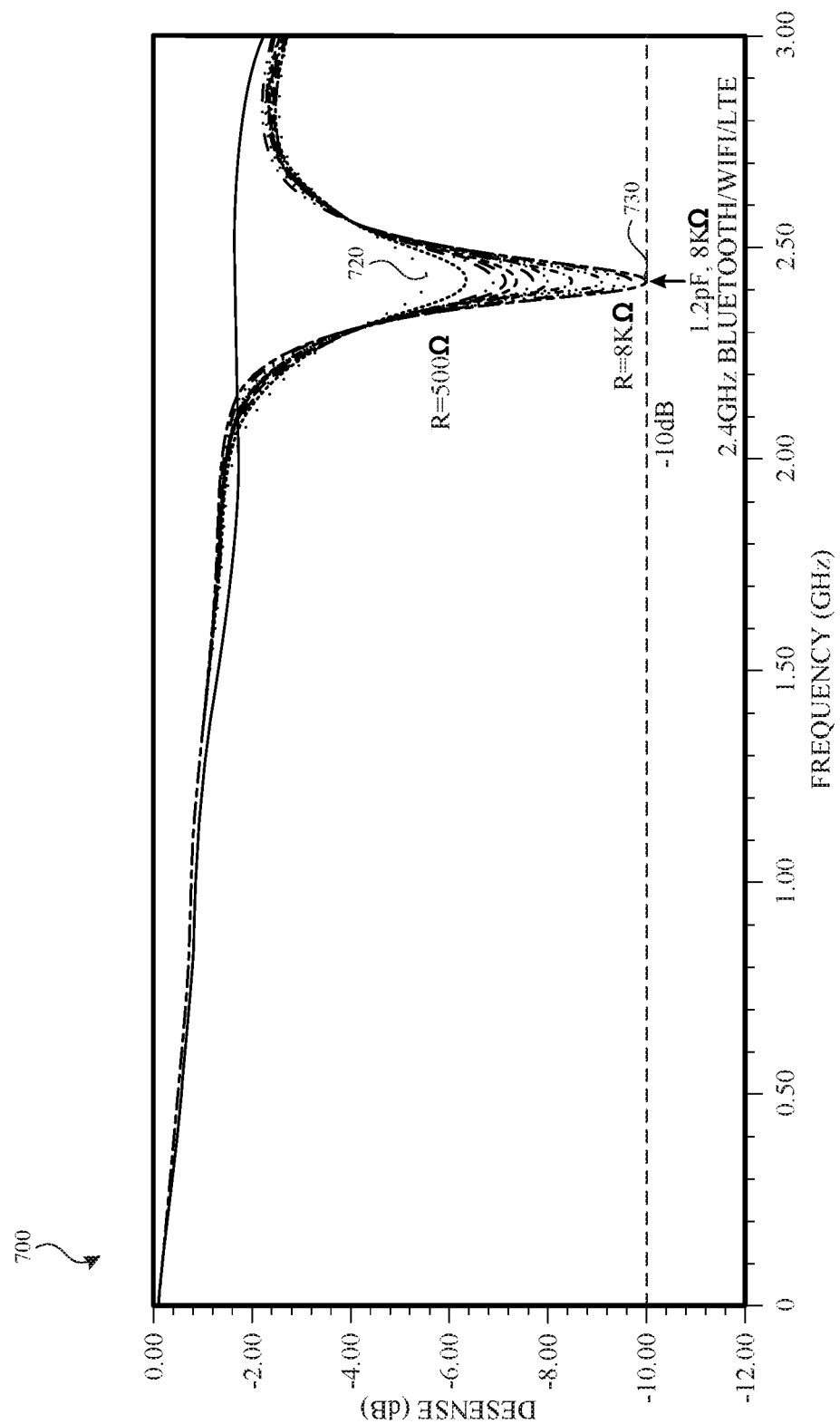
FIG. 7 is a chart illustrating example plots of frequency response of the desense filter of FIG. 2 in accordance with one or more aspects of the subject technology.

FIG. 7 is a chart illustrating example plots of frequency response 700 of the desense filter 210 of FIG. 2 in accordance with one or more aspects of the subject technology. The plots (e.g., 720 and 730) of FIG. 7 are obtained by using HFSS to simulate the desense filter. The plots of the frequency response 700 are similar to the plots of the frequency response 600 FIG. 6, except that in the case of FIG. 7, instead of varying the capacitance of the variable capacitance (e.g., 516 of FIG. 5), the resistance of the resistor (e.g., 514 of FIG. 5) is changed. The variation in resistance has no effect on the resonance frequency ($1/2\pi\sqrt{LC}$) of the desense filter, and changes the amount of the noise energy that is dissipated by the resistor. Accordingly, as the resistance value changes from about 500Ω to about 8 kΩ, as represented by plots 720 and 730, the amount of highest desense changes from about −5.5 dB to about −10 dB, which are sufficiently high to combat the 3 dB noise in the 2.4 GHz band of Wi-Fi, Bluetooth, and/or LTE communication protocols.

Figure 8:
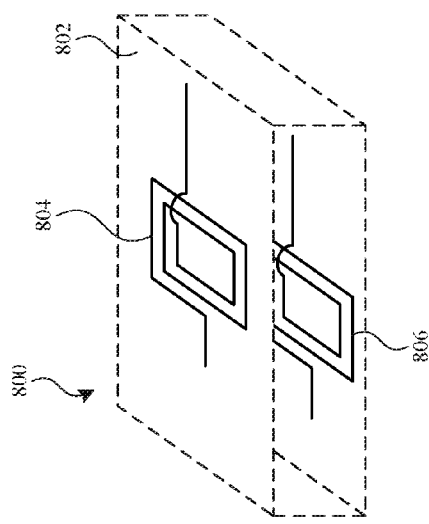
FIG. 8 is a diagram illustrating an exemplary implementation of primary and secondary windings of the desense filter of FIG. 2, in accordance with one or more aspects of the subject technology.

FIG. 8 is a diagram illustrating an exemplary implementation 800 of primary and secondary windings of the desense filter of FIG. 2, in accordance with one or more aspects of the subject technology. In one or more aspects, such as the implementation 800, the primary winding 804 and the secondary windings 806 of the transformer of the desense filter (e.g., 210 of FIG. 2) are implemented by spiral inductors on two different layers of a multi-layer flex circuit 802 of FIG. 8, where the magnetic coupling between the two windings is through the inter-layers of the flex circuit 802. The primary winding 804 and the secondary windings 806 can be implemented using on-flex conductor traces.

Figure 9:
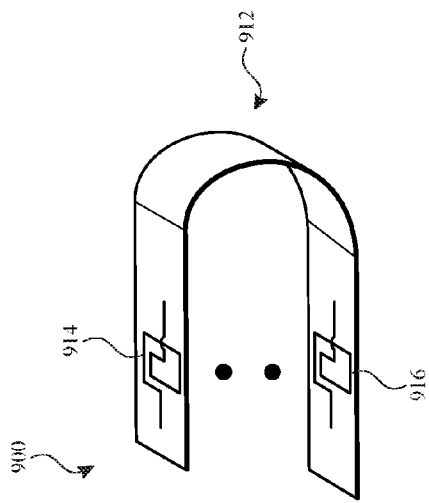
FIG. 9 is a diagram illustrating an exemplary implementation of primary and secondary windings of the desense filter of FIG. 2, in accordance with one or more aspects of the subject technology.

FIG. 9 is a diagram illustrating an exemplary implementation 900 of primary and secondary windings of the desense filter of FIG. 2, in accordance with one or more aspects of the subject technology. In some aspects, such as the implementation 900, a flex circuit 912 may be a bent flex circuit that allows the primary winding 914 and the secondary windings 916 formed as spiral inductors on flat sections of the flex circuit 912 on both sides of the bend, as shown in FIG. 9. The primary winding 914 and the secondary windings 916 can be implemented using on-flex conductor traces. The magnetic coupling between the primary winding 914 and the secondary windings 916 can partially be through a gap (e.g., air gap) between the two flat sections of the flex circuit 912. The implementation of the transformer of the desense filter is not limited to the implementations discussed above. Other approaches, such as the use of discrete components, can be implemented.

Figure 10:
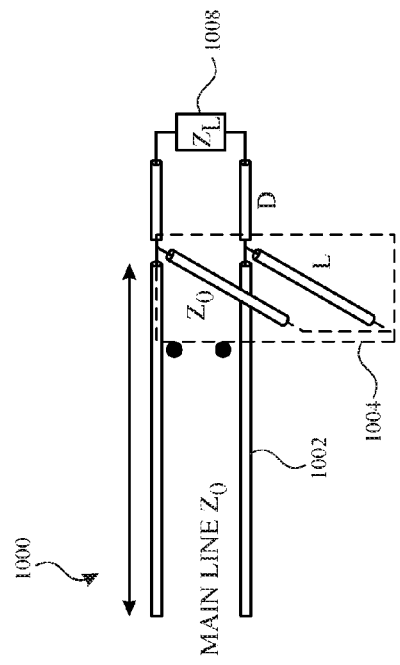
FIG. 10 is a diagram illustrating an example implementation of the variable capacitor of the desense filter of FIG. 2, in accordance with one or more aspects of the subject technology.

FIG. 10 is a diagram illustrating an example implementation 1000 of the variable capacitor of the desense filter 210 of FIG. 2, in accordance with one or more aspects of the subject technology. The variable capacitor (e.g., 304 of FIG. 3) can be implemented in a variety of ways. In some aspects, the variable capacitor can be implemented by transmission line stubs. For example, in the implementation 1000, the transmission line stub 1004 can act as a variable capacitor, the capacitance of which can be varied, for instance, by adjusting its length L. An input impedance of a transmission line stub is given as: $X_{sc}=j\ Z_0\ \tan(\beta L)$, where $\beta=\delta 2\pi/\lambda$ can be positive or negative. The parameters $Z_0$, L, and $\lambda$ are the characteristic impedance of the transmission line 1002, the length of the stub, and a corresponding wavelength, respectively. The resistance 1008 of the filter is depicted as the load impedance $Z_L$. In some implementations, the transmission line 1002 can be used to implement the inductance of the secondary winding of the transformer, by selecting a length l of the transmission line such that $\tan(\beta l)$ becomes positive.

Figure 11:
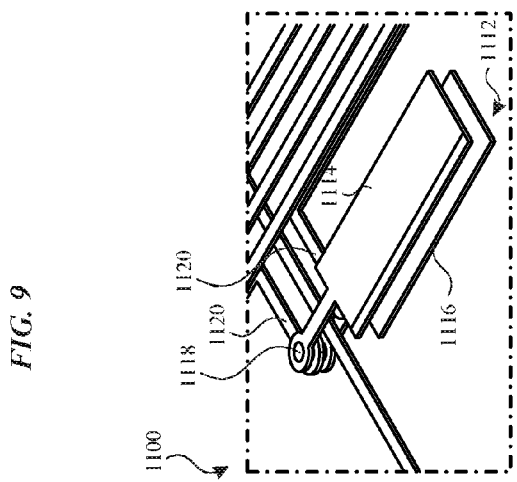
FIG. 11 is a diagram illustrating an example implementation of the variable capacitor of the desense filter of FIG. 2, in accordance with one or more aspects of the subject technology.

FIG. 11 is a diagram illustrating an example implementation 1100 of the variable capacitor of the desense filter of FIG. 2, in accordance with one or more aspects of the subject technology. In the implementation 1100 of FIG. 11, the variable capacitor 1112 is implemented by two conductor pads 1114 and 1116 formed on two sides of a layer of a flex circuit. In some aspects, the two conductor pads 1114 and 1116 can be separated by more than one layer of the flex circuit. As is well known, the amount of capacitance depends on the area of the two conductor pads 1114 and 1116 and thickness and dielectric constant of the dialectic material of the flex circuit. The top conductor pad 1114 is coupled to a terminal 1118 of the secondary winding 1120 of the desense filter transformer. Similarly, the bottom conductor pad 1116 is coupled to another terminal of the secondary winding 1120. In some implementations, the variable capacitor (e.g., 304 of FIG. 3) can be implemented using a varactor diode (e.g., a reversed biased Schottky diode). In some aspects, the varactor diode can be a discrete element.

In a varactor diode, the capacitance is formed by the depletion region of the reversed biased P-N junction of the diode.

Figure 12:
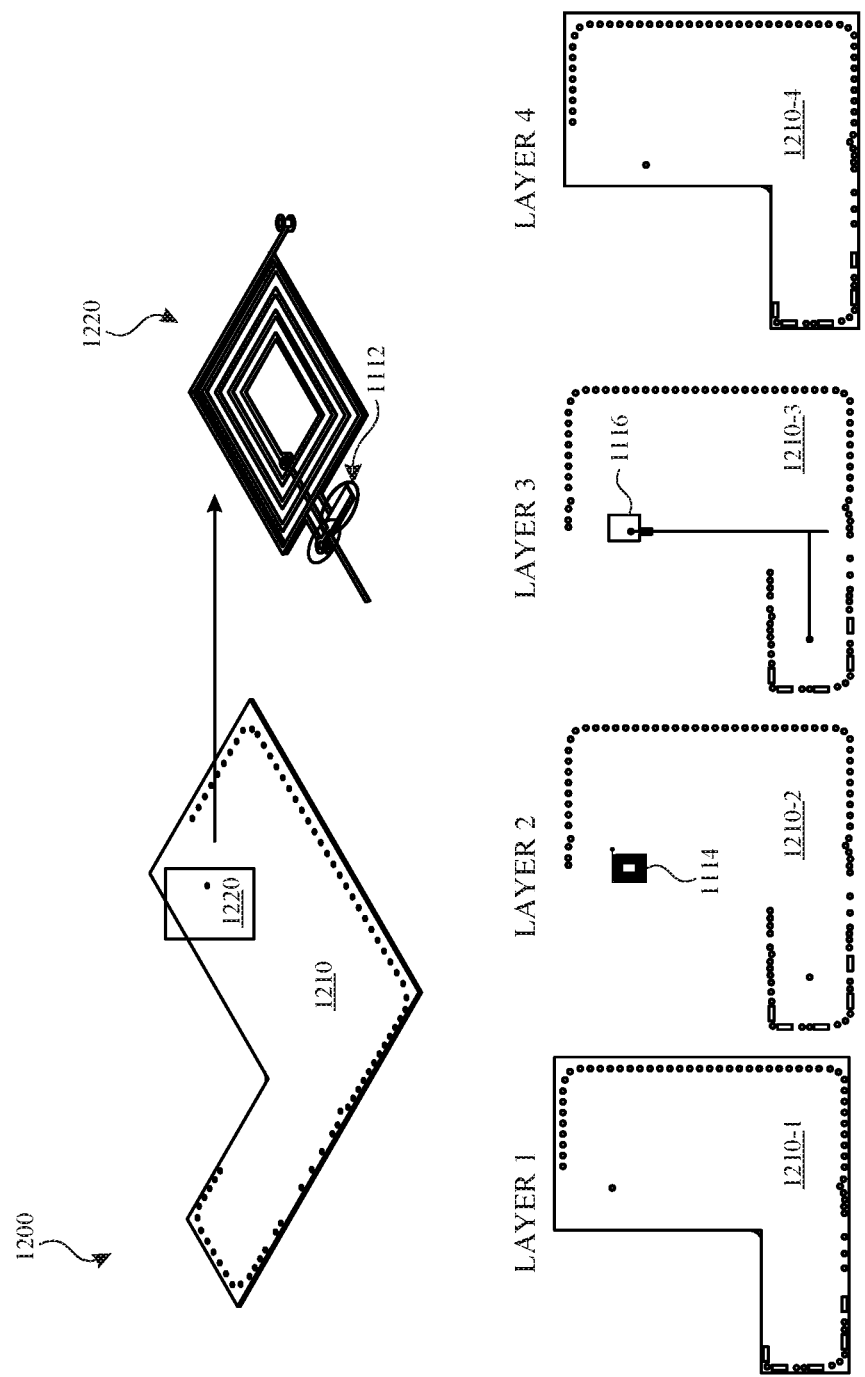
FIG. 12 is a diagram illustrating an example on-flex implementation of the variable capacitor of the desense filter of FIG. 2, in accordance with one or more aspects of the subject technology.

FIG. 12 is a diagram illustrating an example on-flex implementation 1200 of the variable capacitor 1112 of the desense filter 1220, in accordance with one or more aspects of the subject technology. In some aspects, the desense filter 1220 is similar to the desense filter 210 of FIG. 2 and is implemented on a flex circuit 1210. The flex circuit 1210 can be a multi-layer flex circuit having a number of (e.g., 4) layers (e.g., 1210-1 through 1201-4). As discussed above, the variable capacitor 1112 can be implemented on two layers of the flex circuit 1210. In the embodiment shown in FIG. 12, the conductor pads 1114 and 1116 are formed on layers 1210-2 and 1210-3 of the flex circuit 1210.

Figure 13:
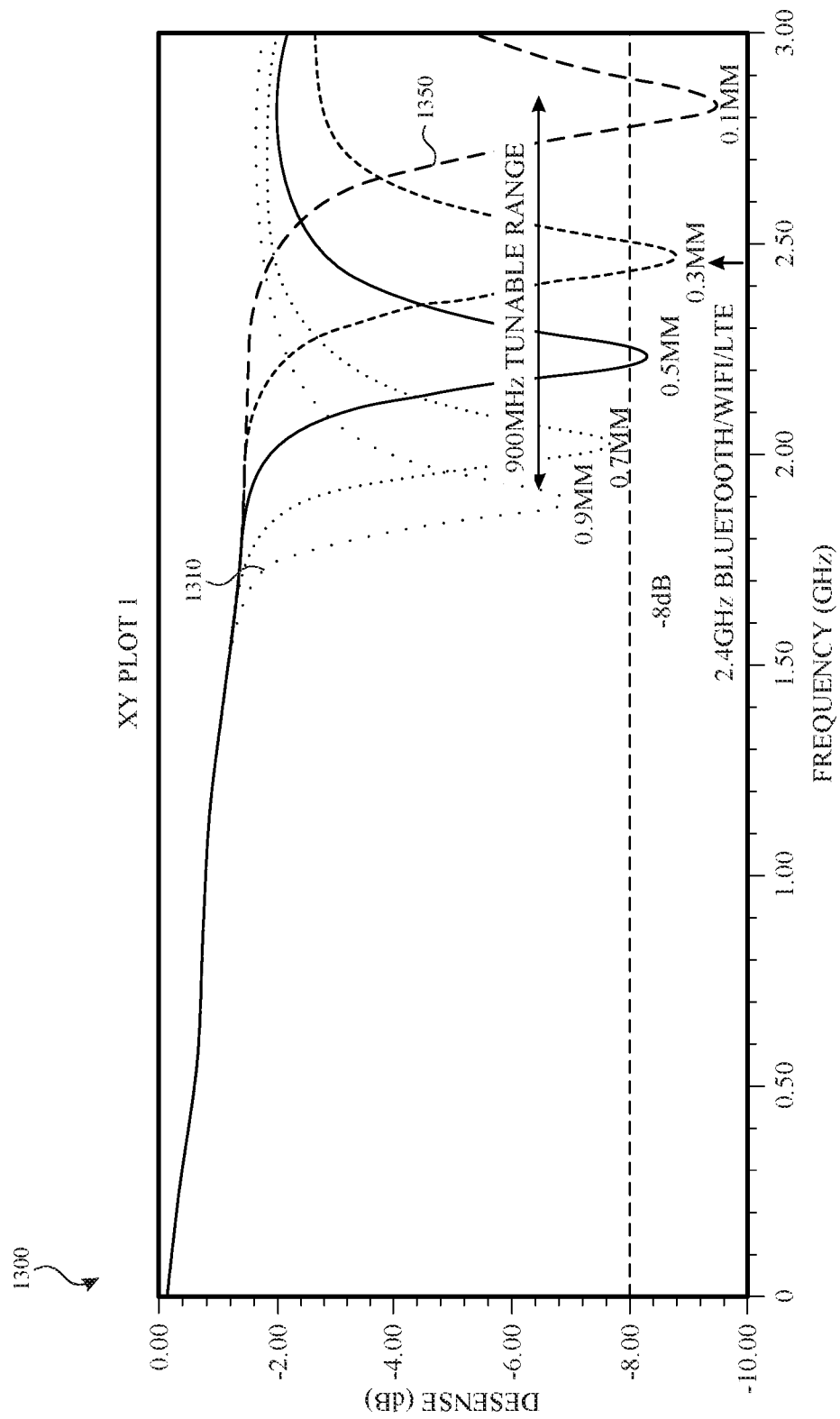
FIG. 13 is a chart illustrating example plots of frequency response of the desense filter of FIG. 12, in accordance with one or more aspects of the subject technology.

FIG. 13 is a chart illustrating example plots of frequency response 1300 of the desense filter 1220 of FIG. 12, in accordance with one or more aspects of the subject technology. The frequency response 1300 is similar to the frequency response 600 of FIG. 6 described above, except that in the frequency response 1300, the plots (e.g., 1310 through 1350) are for different values of the length of the conductor pads (e.g., 1114 and 1116 of FIG. 11), which are varied between 0.9 mm (e.g., plot 1310) and 0.1 mm (e.g., plot 1350). As explained above, the larger length of the conductor pads results in larger areas and consequently larger capacitance C, which leads to a lower resonance frequency ($f_r=1/2\pi\sqrt{LC}$) of the highest desense point of the frequency response 1300. The tuning based on length of the conductor pads can cover a frequency range of about 900 MHz within the 2.4 GHz band of the Wi-Fi, Bluetooth, and/or LTE communication protocols.

Figure 14:
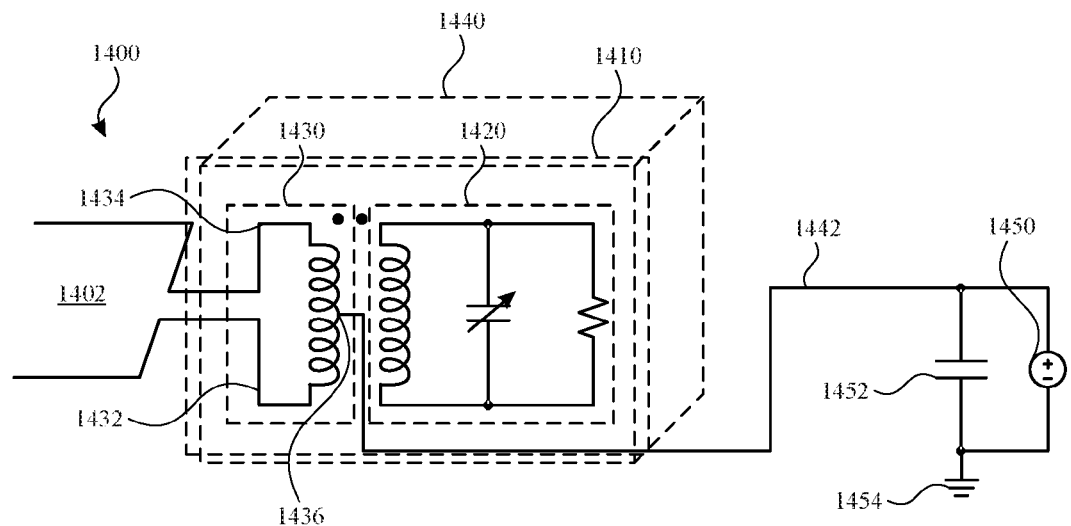
FIG. 14 illustrates a schematic diagram including an example of a desense filter, in accordance with one or more aspects of the subject technology.

FIG. 14 illustrates a schematic diagram 1400 including an example of a desense filter 1410, in accordance with one or more aspects of the subject technology. The schematic diagram 1400 includes the noise source 1402, a desense filter (apparatus) 1410, a shield 1440, a conductor trace 1442, a power source 1450, and a bypass capacitor 1452. In some aspects, the noise source 1402 can be a display driver circuit or a PMIC that is far from the RF ground 1454 and is coupled via the conductor trace 1442 of a flex circuit (e.g., a multi-layer flex circuit) to the power source 1450. The desense filter 1410 is positioned as close as possible to the noise source 1402.

The desense filter 1410 includes a transformer having a primary winding 1430 and a secondary circuit 1420. The terminals 1432 and 1434 of the primary winding 1430 are connected to two symmetric conductor (e.g. DC) traces of the flex circuit to the noise source 1402. A center tap 1436 of the primary winding 1430 is coupled via the conductor trace 1442 to the power source 1450. The primary winding is acting as a balun and converts a single ended signal (e.g., of 1442) to a differential ended signal coupled to the noise source 1402. The secondary circuit 1420 is similar to the secondary circuit 220 of FIG. 2, and includes the secondary winding couple to an RC circuit including a variable capacitor (e.g., similar to 234 of FIG. 2) and a resistor (e.g., similar to 236 of FIG. 2). In some aspects, the primary windings 1430 and the secondary circuit 1420 can be implemented similar to the implementations shown and discussed with respect to FIGS. 3, 5, 11, and 12 above. The tuning of the desense filter 1410 can be done similar to the tuning of the desense filters 210 of FIG. 2 and 1210 of FIG. 12, as described with respect to frequency responses 600, 700, and 1300 of FIGS. 6, 7, and 13, respectively. The filter 1410 can be covered with the shield 1440 to prevent magnetic coupling with other nearby circuits.

Figure 15:
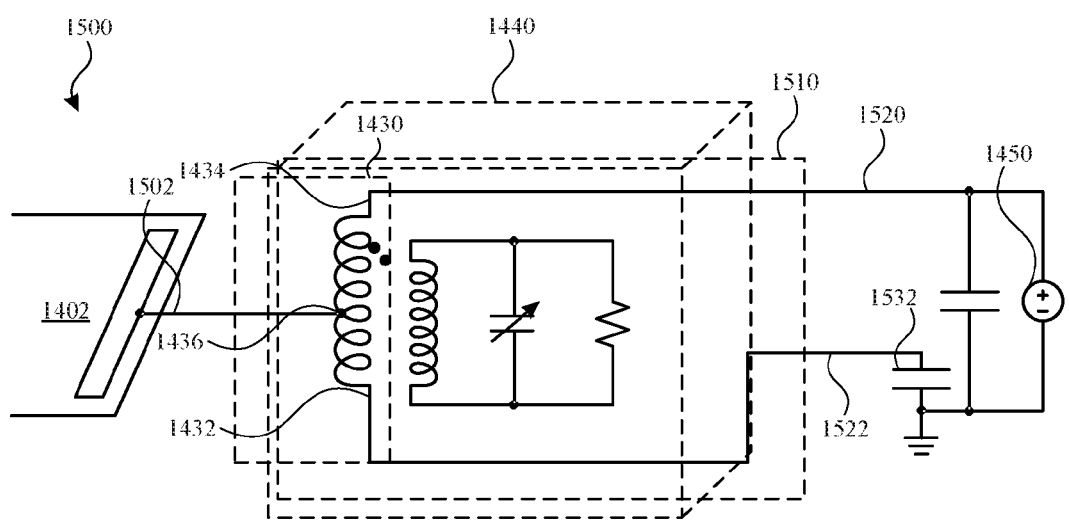
FIG. 15 illustrates a schematic diagram including an example of a desense filter, in accordance with one or more aspects of the subject technology.

FIG. 15 illustrates a schematic diagram 1500 including an example of a desense filter 1510, in accordance with one or more aspects of the subject technology. The desense filter 1510 is similar to the desense filter 1410 of FIG. 41, except for connections of the primary winding 1430. As shown in FIG. 15, in the implementation shown in the schematic diagram 1500, the center tap 1436 of the primary winding 1430 is coupled via a conductor trace 1502 to the noise source 1402. The terminals 1134 and 1432 of the primary winding 1430 are connected through conductor 1520 and 1522 to the power source 1450 and a second bypass capacitor 1532, respectively. In some aspects, the desense filter 1510 can be implemented using similar implementations as shown and discussed with respect to FIGS. 3, 4, 8, and 9 above. The tuning of the desense filter 1510 can be done similar to the tuning of the desense filters 210 of FIG. 2 and 1210 of FIG. 12, as described with respect to frequency responses 600, 700, and 1300 of FIGS. 6, 7, and 13, respectively. The filter 1510 can be covered with the shield 1440 to prevent magnetic coupling with other nearby circuits.

Figure 16:
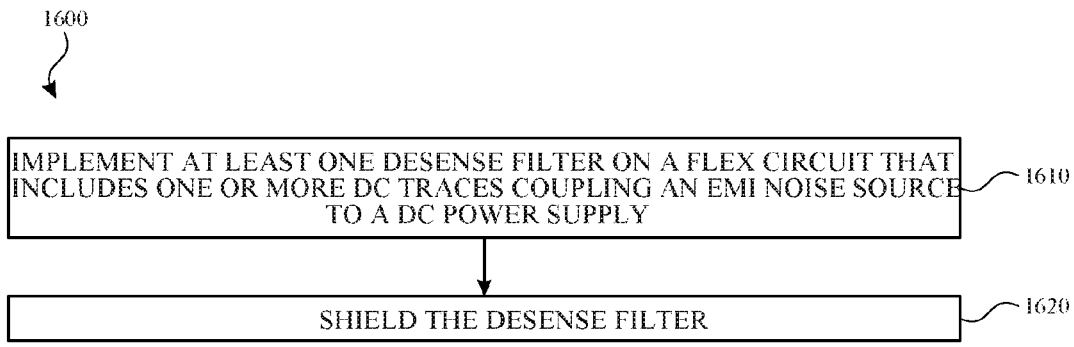
FIG. 16 is a flow diagram illustrating a method of providing a desense filter, in accordance with one or more aspects of the subject technology.

FIG. 16 is flow diagram illustrating a method 1600 of providing a desense filter, in accordance with one or more aspects of the subject technology. The method 1600 starts with implementation of at least one desense filter (e.g., 210 of FIG. 2) on a flex circuit (e.g., 510 of FIG. 5) that includes one or more DC traces (e.g., 110 of FIG. 1) that couples an EM noise source (e.g., 130 of FIG. 1) to a DC power supply (e.g., 140 of FIG. 1) (1610). The desense filter is shielded (e.g., using 240 of FIG. 2) (1620).

Figure 17:
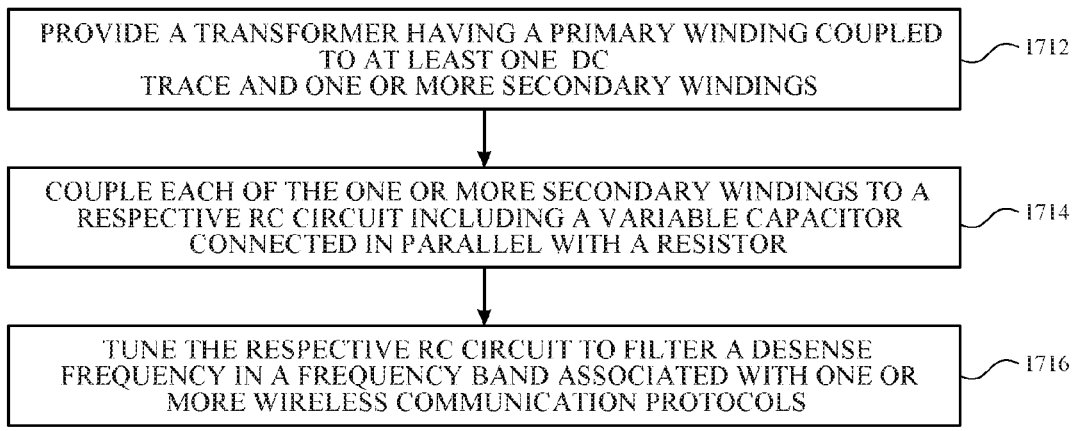
FIG. 17 is a flow diagram illustrating of a method of implementing the desense filter of the method of FIG. 16, in accordance with one or more aspects of the subject technology.

FIG. 17 is a flow diagram illustrating of a method 1700 of implementing the desense filter of the method 1600 of FIG. 16, in accordance with one or more aspects of the subject technology. The implementation of the desense filter (e.g., 210 of FIG. 2) is performed by providing a transformer having a primary winding (e.g., 212 of FIG. 2) coupled to at least one DC trace (e.g., 250 of FIG. 2) and one or more secondary windings (e.g., 232 of FIG. 2) (1712). The implementation of the desense filter further includes coupling each of the one or more secondary windings (e.g., 232-1, through 232-M of FIG. 4) to a respective RC circuit (e.g., 424-1, through 424-M of FIG. 4 and 230 of FIG. 2) including a variable capacitor (e.g., 234 of FIG. 2) connected in parallel with a resistor (e.g., 236 of FIG. 2) (1714), and tuning the respective RC circuit to filter a desense frequency (e.g., as shown in frequency responses 600, 700, and 1300 of FIGS. 6, 7, and 13) in a frequency band (e.g., 2.4 GHz) associated with one or more wireless communication protocols (e.g., Wi-Fi, LTE, and Bluetooth) (1716).

Figure 18:
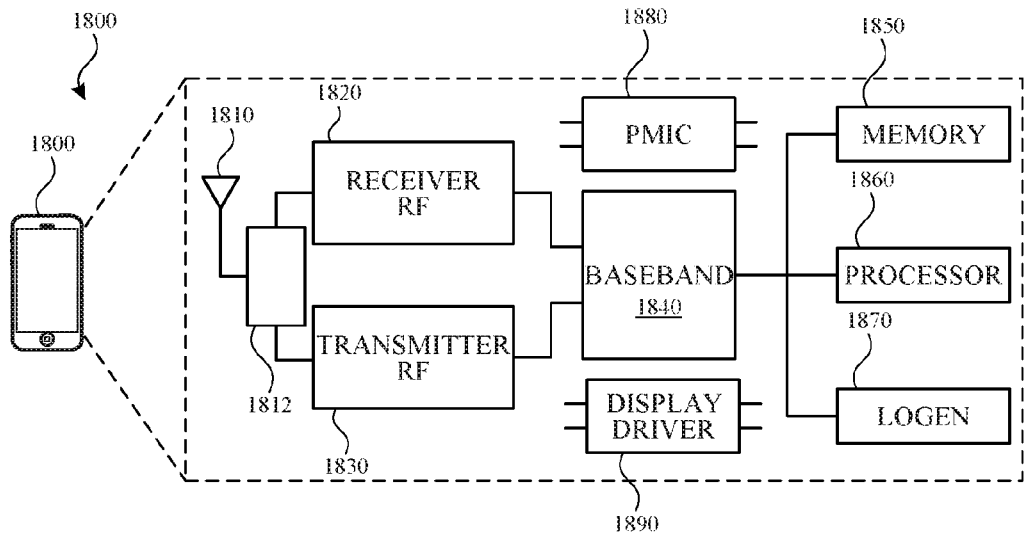
FIG. 18 is a block diagram illustrating an example wireless communication device, in accordance with one or more implementations of the subject technology.

FIG. 18 is a block diagram illustrating an example wireless communication device 1800, in accordance with one or more implementations of the subject technology. The wireless communication device 1800 may comprise a radio-frequency (RF) antenna 1810, a receiver 1820, a transmitter 1830, a baseband processing module 1840, a memory 1850, a processor 1860, a local oscillator generator (LOGEN) 1870, a PMIC 1880, and a display driver 1890 connected to a display (not shown). In various embodiments of the subject technology, one or more of the blocks represented in FIG. 18 may be integrated on one or more semiconductor substrates. For example, the blocks 1820-1870 may be realized in a single chip or a single system on a chip, or may be realized in a multi-chip chipset.

The receiver 1820 may comprise suitable logic circuitry and/or code that may be operable to receive and process signals from the RF antenna 1810. The receiver 1820 may, for example, be operable to amplify and/or down-convert received wireless signals. In various embodiments of the subject technology, the receiver 1820 may be operable to cancel noise in received signals and may be linear over a wide range of frequencies. In this manner, the receiver 1820 may be suitable for receiving signals in accordance with a variety of wireless standards, Wi-Fi, WiMAX, Bluetooth, and various cellular standards. In various embodiments of the subject technology, the receiver 1820 may not require any SAW filters and few or no off-chip discrete components such as large capacitors and inductors.

The transmitter 1830 may comprise suitable logic circuitry and/or code that may be operable to process and transmit signals from the RF antenna 1810. The transmitter 1830 may, for example, be operable to up-convert baseband signals to RF signals and amplify RF signals. In various embodiments of the subject technology, the transmitter 1830 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 1830 may be operable to provide signals for further amplification by one or more power amplifiers.

The duplexer 1812 may provide isolation in the transmit band to avoid saturation of the receiver 1820 or damaging parts of the receiver 1820, and to relax one or more design requirements of the receiver 1820. Furthermore, the duplexer 1812 may attenuate the noise in the receive band. The duplexer may be operable in multiple frequency bands of various wireless standards.

The baseband processing module 1840 may comprise suitable logic, circuitry, interfaces, and/or code that may be operable to perform processing of baseband signals. The baseband processing module 1840 may, for example, analyze received signals and generate control and/or feedback signals for configuring various components of the wireless communication device 1800, such as the receiver 1820. The baseband processing module 1840 may be operable to encode, decode, transcode, modulate, demodulate, encrypt, decrypt, scramble, descramble, and/or otherwise process data in accordance with one or more wireless standards.

The processor 1860 may comprise suitable logic, circuitry, and/or code that may enable processing data and/or controlling operations of the wireless communication device 1800. In this regard, the processor 1860 may be enabled to provide control signals to various other portions of the wireless communication device 1800. The processor 1860 may also control transfers of data between various portions of the wireless communication device 1800. Additionally, the processor 1860 may enable implementation of an operating system or otherwise execute code to manage operations of the wireless communication device 1800. In some aspects, the processor 1860 may partially or entirely perform the functionality of the control circuit 310 of FIG. 3.

The memory 1850 may comprise suitable logic, circuitry, and/or code that may enable storage of various types of information such as received data, generated data, code, and/or configuration information. The memory 1850 may comprise, for example, RAM, ROM, flash, and/or magnetic storage. In various embodiment of the subject technology, information stored in the memory 1850 may be utilized for configuring the receiver 1820 and/or the baseband processing module 1840.

The local oscillator generator (LOGEN) 1870 may comprise suitable logic, circuitry, interfaces, and/or code that may be operable to generate one or more oscillating signals of one or more frequencies. The LOGEN 1870 may be operable to generate digital and/or analog signals. In this manner, the LOGEN 1870 may be operable to generate one or more clock signals and/or sinusoidal signals. Characteristics of the oscillating signals such as the frequency and duty cycle may be determined based on one or more control signals from, for example, the processor 1860 and/or the baseband processing module 1840.

In operation, the processor 1860 may configure the various components of the wireless communication device 1800 based on a wireless standard according to which it is desired to receive signals. Wireless signals may be received via the RF antenna 1810 and amplified and down-converted by the receiver 1820. The baseband processing module 1840 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device, data to be stored to the memory 1850, and/or information affecting and/or enabling operation of the wireless communication device 1800. The baseband processing module 1840 may modulate, encode and perform other processing on audio, video, and/or control signals to be transmitted by the transmitter 1830 in accordance with various wireless standards.

The PMIC 1880 may provide power for and manage power distribution to various modules and components of the communication device 1800. The display driver 1890 may be coupled to a display of the communication device 1800. In some implementations, the display driver 1890 may be implemented or be coupled to a flex circuit.

In some aspects, the PMIC 1880 and/or the display driver 1890 may generate EMI noise within the frequency band of the Wi-Fi, Bluetooth and/or LTE communication protocols. The communication device 1800 can use the desense filter (e.g., 210 of FIG. 2) of the subject technology, as described above, to prevent the EMI noise from the PMIC 1880 and/or the display driver 1890, or other noise sources (e.g., any other circuitry of the communication device 1800 that is far from an RF ground and cannot be coupled through a coupling capacitor to the RF ground) from desensing the antenna 1810.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An apparatus comprising:
a flex circuit including one or more conductive traces; and
at least one desense filter including a transformer having a primary winding coupled to at least one of the one or more conductive traces, wherein each of the at least one desense filters further includes one or more circuits coupled to a secondary winding of the transformer, each of the one or more circuits includes a variable capacitor coupled to a resistor, and each of the at least one desense filters is tunable to filter noise at a desense frequency in a frequency band associated with one or more wireless communication protocols.

2. The apparatus of claim 1, further comprising an electromagnetic interference (EMI) shield covering the least one desense filter, wherein the at least one desense filter is positioned near an EMI noise source that generates noise at the desense frequency.

3. The apparatus of claim 1, wherein the flex circuit includes a single conductive trace coupling an EMI noise source to a power supply through the primary winding of the transformer, wherein the EMI noise source is distant from a ground potential to be filtered by a decoupling capacitor.

4. The apparatus of claim 3, wherein the EMI noise source comprises a display driver circuit coupled to one of the one or more conductive traces, wherein the display driver circuit includes a demultiplexer coupled to one of the one or more conductive traces.

5. The apparatus of claim 1, wherein a capacitance value of the variable capacitor is controlled by a control circuit and a digital-to-analog converter (DAC), and wherein the variable capacitor comprises one of a varactor diode, a transmission line stub, a discrete capacitor, or a capacitor formed by parallel conductor planes implemented on two flex layers of the flex circuit.

6. The apparatus of claim 5, wherein the transformer includes multiple secondary windings, each secondary winding being coupled to a respective circuit, wherein a capacitance of a respective circuit of each secondary winding is set to a different value corresponding to a respective desense frequency to provide a wider desense band including multiple desense frequencies, wherein the variable capacitor of the circuit is connected in parallel with the resistor.

7. The apparatus of claim 1, wherein the primary winding and the secondary winding of the transformer are implemented by loops formed by conductor traces on the flex circuit, wherein the flex circuit is bent to form a first flex circuit portion that is nearly parallel with a second flex circuit portion, and wherein the primary winding is implemented on the first flex circuit portion and the secondary winding is implemented on the second flex circuit portion.

8. The apparatus of claim 1, wherein the primary winding and the secondary winding of the transformer are implemented by loops formed by conductor traces on the flex circuit, wherein the primary winding and the secondary winding of the transformer are implemented on two separate flex layers of the flex circuit.

9. The apparatus of claim 1, wherein the one or more wireless communication protocols include at least one of Wi-Fi, Bluetooth, and long-term evolution (LTE) protocols.

10. An apparatus comprising:
a multilayer flex circuit including one or more conductive traces; and
one or more desense filters, each desense filter comprising:
a transformer having a primary winding and one or more secondary windings; and
one or more circuits coupled to the one or more secondary windings,
wherein the primary winding includes a center tap, at least one of the center tap or two terminals of the primary winding are coupled to a power source through one or two of the one or more conductive traces, each of the one or more circuits includes a variable capacitor coupled to a resistor, and each of the one or more desense filters is tunable to filter noise generated by an electromagnetic interference (EMI) noise source at a desense frequency in a frequency band associated with one or more wireless communication protocols.

11. The apparatus of claim 10, further comprising an EMI shield configured to protect the one or more desense filters against EMI, wherein the one or more desense filters is implemented on the multilayer flex circuit near a noise source generating noise at the desense frequency.

12. The apparatus of claim 10, wherein the multilayer flex circuit includes a single conductive trace coupling the EMI noise source to the center tap, and the two terminals of the primary winding are coupled through two traces of the one or more conductive traces to a power supply, wherein the EMI noise source is distant from a ground potential to be filtered by a decoupling capacitor.

13. The apparatus of claim 10, wherein the multilayer flex circuit includes symmetric conductive traces coupling the EMI noise source to the two terminals of the primary winding, and the center tap of the primary winding is coupled through a trace of the one or more conductive traces to a power supply, wherein the EMI noise source is too far away from a ground potential to be filtered by a decoupling capacitor.

14. The apparatus of claim 10, wherein the transformer includes multiple secondary windings coupled to multiple respective circuits tunable to multiple respective desense frequencies to achieve a wider desense band including multiple desense frequencies, and wherein the variable capacitor of the circuit is connected in parallel with the resistor.

15. The apparatus of claim 10, further comprising a control circuit and a digital-to-analog converter (DAC) to control a capacitance value of the variable capacitor, and wherein the variable capacitor comprises one of a varactor diode, a transmission line stub, a discrete capacitor, or a capacitor formed by parallel conductor planes implemented on two flex layers of the multilayer flex circuit.

16. The apparatus of claim 10, wherein the primary winding and the one or more secondary windings of the transformer are implemented by loops formed by conductor traces on the multilayer flex circuit, wherein the flex circuit is a bent flex circuit including a first flex circuit portion that is nearly parallel with a second flex circuit portion, and wherein the primary winding is implemented on the first flex circuit portion and the one or more secondary windings are implemented on the second flex circuit portion.

17. The apparatus of claim 10, wherein the primary winding and the one or more secondary windings of the transformer are implemented by loops formed by conductor traces on two separate flex layers of the multilayer flex circuit.

18. A method comprising:
implementing at least one desense filter on a flex circuit that includes one or more conductive traces coupling an electromagnetic interference (EMI) noise source to a power supply; and
shielding the at least one desense filter wherein implementing a respective one of the at least one desense filter comprises:
providing a transformer having a primary winding coupled to at least one of the one or more of the conductive traces and one or more secondary windings;
coupling each of the one or more secondary windings to a respective circuit including a variable capacitor connected in parallel with a resistor; and
tuning the respective circuit to filter noise at a desense frequency in a frequency band associated with one or more wireless communication protocols.

19. The method of claim 18, further comprising implementing the primary winding and the one or more secondary windings of the transformer using loops formed by conductor traces on the flex circuit, wherein the flex circuit is a bent flex circuit, and wherein the method further comprises implementing the primary winding and the one or more secondary windings, respectively, on a first and a second portion of the bent flex circuit on opposite sides of a bent section.

20. The method of claim 18, further comprising implementing the primary winding and the one or more secondary windings of the transformer by loops formed by conductor traces on two separate flex layers of the flex circuit, and wherein tuning the respective circuit to filter the desense frequency comprises tuning a capacitance of the variable capacitor of the respective circuit.

* * * * *